(12) United States Patent
Lin et al.

(10) Patent No.: US 9,454,942 B2
(45) Date of Patent: Sep. 27, 2016

(54) DISPLAY PANEL, GATE DRIVER AND CONTROL METHOD

(71) Applicant: AU Optronics Corporation, Hsin-Chu (TW)

(72) Inventors: Chih-Lung Lin, Hsin-Chu (TW); Yuan-Wei Du, Hsin-Chu (TW); Fu-Hsing Chen, Hsin-Chu (TW); Chun-Da Tu, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 15 days.

(21) Appl. No.: 14/644,692

(22) Filed: Mar. 11, 2015

(65) Prior Publication Data

US 2016/0118009 A1    Apr. 28, 2016

(30) Foreign Application Priority Data

Oct. 22, 2014 (TW) .............................. 103136498 A

(51) Int. Cl.
*G09G 3/36* (2006.01)
*H03K 19/0185* (2006.01)

(52) U.S. Cl.
CPC .... *G09G 3/3677* (2013.01); *H03K 19/018507* (2013.01); *G09G 2310/0289* (2013.01)

(58) Field of Classification Search
CPC .................. G09G 3/3677; G09G 2310/0289; G09G 3/3685; G09G 3/3696; H03K 19/018507; G11C 19/184
See application file for complete search history.

(56) References Cited

U.S. PATENT DOCUMENTS

| | | | |
|---|---|---|---|
| 2006/0187177 A1 | 8/2006 | Kuo et al. | |
| 2008/0117157 A1* | 5/2008 | Hwang | ................ G09G 3/3611 345/92 |
| 2010/0033208 A1 | 2/2010 | Kuo et al. | |

FOREIGN PATENT DOCUMENTS

CN          104008738 A         8/2014

* cited by examiner

*Primary Examiner* — Abbas Abdulselam
(74) *Attorney, Agent, or Firm* — WPAT, PC; Justin King

(57) ABSTRACT

A display panel includes gate lines and a gate driver. The gate driver includes series coupled driving stages, in which an N-th driving stage of the series-coupled driving stages includes a driving unit and an input control unit. The driving unit transmits a first clock signal according to a control voltage level of a control node, so as to output a gate-driving signal. The input control unit transmits the gate-driving signal outputted from an (N−1)-th driving stage to the control nodes, so as to adjust the control voltage level to one of a first voltage level and a second voltage level. A predetermined time interval is present between a rising edge of the first clock signal and a falling edge of the second clock signal. During the predetermined time interval, the control voltage level is pulled to the first voltage level by the input control unit.

17 Claims, 6 Drawing Sheets

DISPLAY PANEL, GATE DRIVER AND CONTROL METHOD

RELATED APPLICATIONS

This application claims priority to Taiwan Application Serial Number, 103136498, filed Oct. 22, 2014, which is herein incorporated by reference.

BACKGROUND

1. Technical Field

The present disclosure relates to a display panel. More particularly, the present disclosure relates to a gate driver of a display panel.

2. Description of Related Art

Recently, liquid crystal displays (LCDs) have been widely commercialized in various kinds of products. To increase a visible area of LCD, new techniques featured with a slim border in the LCD keep coming out in the market.

In the techniques, certain control nodes of a gate driver that is configured to drive the display panel are unstable due to capacitive coupling effect, such that the operations of the gate driver are failure.

Therefore, a heretofore-unaddressed need exists to not only improve such issues in the gate driver, but also can be applied to the slim border products.

SUMMARY

An aspect of the present disclosure is to provide a display panel. The display panel includes gate lines and a gate driver. The gate driver includes series-coupled driving stages. Each of the series-coupled driving stages is electrically coupled to a corresponding gate line of the gate lines. An N-th stage of the series-coupled driving stages includes a driving unit and an input control unit. The driving unit is configured to selectively transmit a first clock signal according to a control voltage level of a control node to output a first gate-driving signal. The input control unit is configured to selectively transmit a second gate-driving signal outputted from an (N−1)-th stage of the series-coupled driving stages to the control node according to a second clock signal, so as to adjust the control voltage level to one of a first voltage level and a second voltage level, in which N is a positive integer, and the first voltage level is lower than the second voltage level. A predetermined time interval is present between a rising edge of the first clock signal and a falling edge of the second clock signal, and the input control unit pulls the control voltage level to the first voltage level during the predetermined time interval.

Another aspect of the present disclosure is to provide a gate driver. The gate driver includes series-coupled driving stages. Each one of the series-coupled driving stages includes a first switch, a second switch, and a first capacitor. A first terminal of the first switch is configured to receive a first clock signal, a second terminal of the first switch is configured to output a first gate-driving signal, and a control terminal of the first switch is coupled to a control node. A first terminal of the second switch is configured to receive a second gate-driving outputted from a previous driving stage, a second terminal of the second switch is coupled to the control node, and a control terminal of the second switch is configured to receive a second clock signal. A first terminal of the first capacitor is coupled to the control node, and a second terminal of the first capacitor is coupled to the second terminal of the first switch. A predetermined time interval is present between a rising edge of the first clock signal and a falling edge of the second clock signal, and the second switch is turned on to keep a voltage level of the control node being at a low voltage level during the predetermined time interval.

Yet another aspect of the present disclosure is to provide a control method for controlling a gate driver. The gate drive includes series-coupled driving stages, in which each of the series-coupled driving stage includes a first switch and a second switch. The control method includes following steps: turning on the second switch to selectively transmit a first gate-driving signal outputted from a previous driving stage to a control node according to a first clock signal, so as to adjust a control voltage level of the control node to one of a first voltage level and a second voltage level, wherein the first voltage level is lower than the second voltage level; and turning on the first switch to receive a second clock signal according to the control voltage level, so as to output a second gate-driving signal, in which predetermined time interval is present between a falling edge of the first clock signal and a rising edge of the second clock, and the control voltage level is pulled down to the first voltage level by the second switch during the predetermined time interval.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
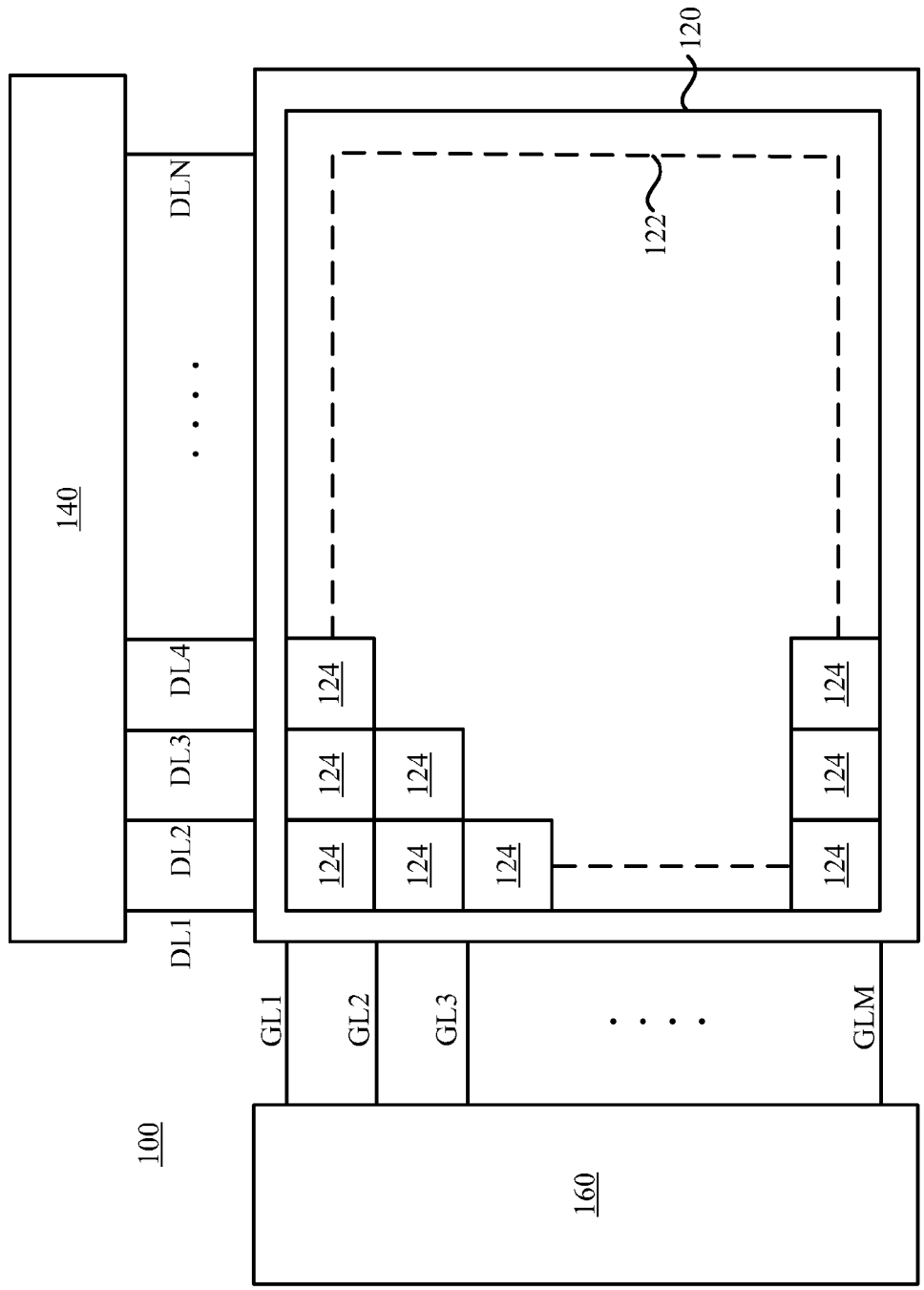
FIG. 1 is a schematic diagram of a display panel according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

Although the terms "first," "second," etc., may be used herein to describe various elements, these elements should not be limited by these terms. These terms are used to distinguish one element from another.

In this document, the term "coupled" may also be termed as "electrically coupled", and the term "connected" may be termed as "electrically connected". "Coupled" and "connected" may also be used to indicate that two or more elements cooperate or interact with each other.

Reference is made to FIG. 1. FIG. 1 is a schematic diagram of a display panel according to one embodiment of the present disclosure. As shown in FIG. 1, the display panel 100 includes a video display area 120, a source driver 140, and a gate driver 160. The video display area 120 includes a pixel array 122, which is formed by data lines DL1-DLN and gate lines GL1-GLM, and pixels 124 that are disposed in the pixel array 122.

The source driver 140 is coupled to the data lines DL1-DLN, and is configured to transmit data signals to a corresponding pixel 124 of the video display area 120 through the data lines DL1-DLN. The gate driver 160 is coupled to the gate lines GL1-GLM, and is configured to sequentially transmit gate-driving signals to the corresponding pixel 124 of the video display area 120 through the gate lines GL1-GLM.

Figure 2:
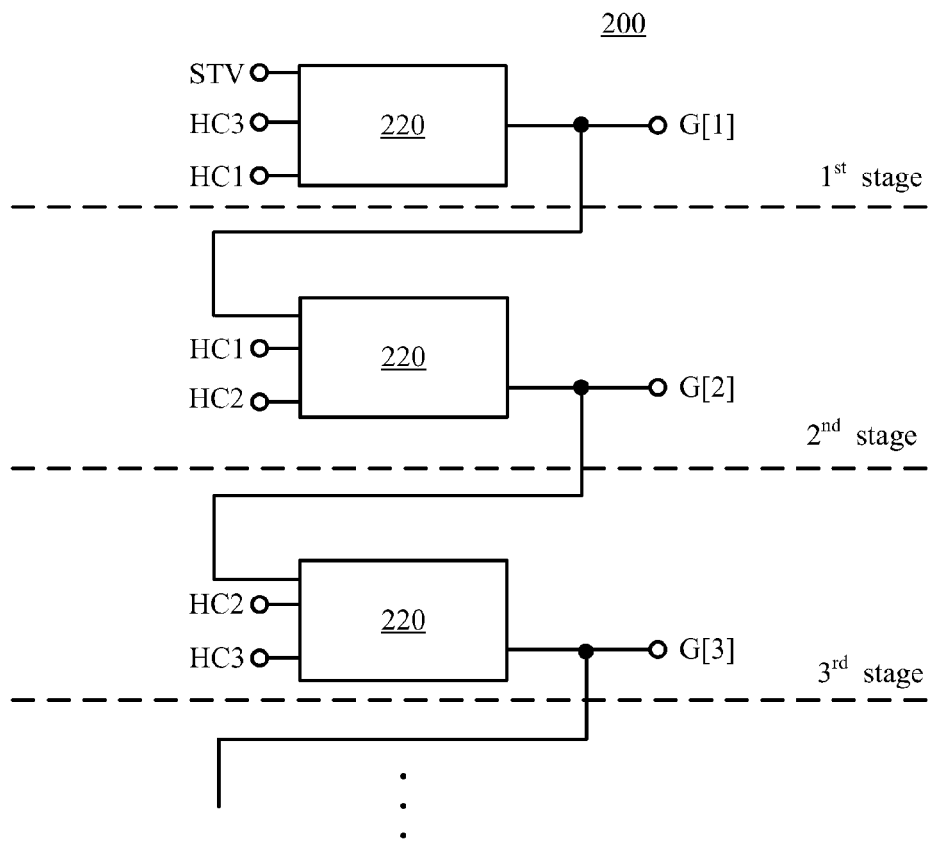
FIG. 2 is a schematic diagram of a gate driver according to one embodiment of the present disclosure.

Reference is made to FIG. 2. FIG. 2 is a schematic diagram of a gate driver according to one embodiment of the present disclosure. As shown in FIG. 2, the gate driver 200 includes driving stages 220. The driving stages 200 are series-coupled, and are configured to generate a corresponding gate-driving signal G[n] according to the gate-driving signal outputted from the previous driving stage 220 and two of a clock signal HC1, a clock signal HC2, and a clock signal HC3. A predetermined phase difference is present between the clock signal HC1, the clock signal HC2, and the clock signal HC3.

For example, as shown in FIG. 2, a first stage of the driving stage 220 is configured to generate the gate-driving signal G[1] according to the clock signal HC3, the clock signal HC1, and an initial signal STV. A second stage of the driving stage 220 is configured to generate the gate-driving signal G[2] according to the clock signal HC1, the clock signal HC2, and the gate-driving signal G[1] outputted from the first stage of the driving stage 220. The third stage of the driving stage 220 is configured to generate the gate-driving signal G[3] according to the clock signal HC2, the clock signal GC3, and the gate-driving signal G[2]. The rest may be deduced by analogy, and thus the gate driver 200 can sequentially output the gate-driving signals G[1]-G[M] to the gate lines GL1-GLM.

The following paragraphs provide certain embodiments related to the driving stages 220 to illustrate functions and applications thereof. However, the present disclosure is not limited to the following embodiments.

Figure 3:
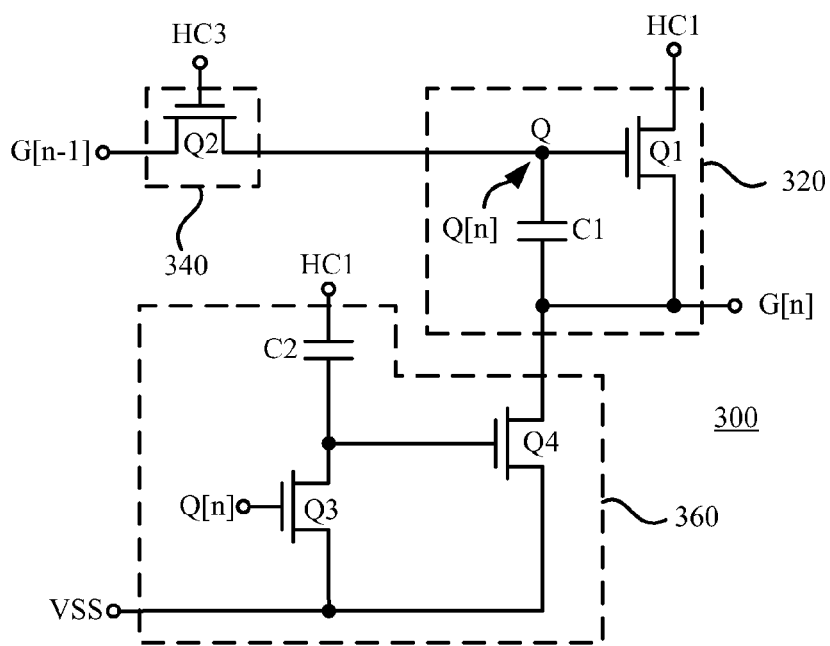
FIG. 3 is a schematic diagram of a driving stage according to one embodiment of the present disclosure.

Reference is made to FIG. 3. FIG. 3 is a schematic diagram of a driving stage according to one embodiment of the present disclosure. In the following paragraphs, the embodiment illustrated in FIG. 3 is described with reference to an N-th stage of the driving stage 220 of the driving stages 220 shown in FIG. 2, in which N is a positive integer.

As shown in FIG. 3, the driving stage 300 includes a driving unit 320, an input control unit 340, and a voltage stabilization unit 360. The driving unit 320 is configured to selectively transmit the clock signal HC1 according to a control voltage level Q[n] of a control node Q, so as to output the gate-driving signal G[n]. The input control unit 340 is configured to selectively transmit the gate-driving signal G[n−1] outputted from an (N−1)-th stage of the driving stage according to the clock signal HC3, so as to adjust the control voltage level Q[n] to one of a voltage level VH and a voltage level VL. In various embodiments, voltage level VL is lower than the voltage level VH. The voltage stabilization unit 360 is configured to pull down the control voltage level Q[n] to the voltage level VH when both of the clock signal HC1 and the clock signal HC3 are at the voltage level VL. In various embodiments, a predetermined time interval is configured to be present between a rising edge of the clock signal HC1 and a falling edge of the clock signal HC3. Through such configuration, the driving stage 300 can operate stably under the effect of capacitive coupling. The specific operations are described later.

In great detail, as shown in FIG. 3, the driving unit 320 includes a capacitor C1 and a switch Q1, and the input control unit 340 includes a switch Q2. A first terminal of the switch Q1 is configured to receive the clock signal HC1, a second terminal of the switch Q1 is configured to output the gate-driving signal G[n], and a control terminal of the switch Q1 is coupled to the control node Q. A first terminal of the capacitor C1 is coupled to the control node Q, and a second terminal of the capacitor C1 is coupled to the second terminal of the switch Q1. The switch Q1 selectively transmits the clock signal HC1 according to the control voltage level Q[n] of the control node Q, so that the clock signal HC1 is outputted as the gate-driving signal G[n] via the second terminal of the switch Q1. A first terminal of the switch Q2 is configured to receive the gate-driving signal G[n−1], a second terminal of the switch Q2 is coupled to the control node Q, and a control terminal of the switch Q2 is configured to receive the clock signal HC3.

Further, the voltage stabilization unit 360 includes a capacitor C2, a switch Q3, and a switch Q4. A first terminal of the capacitor C2 is configured to receive the clock signal HC1. A first terminal of the switch Q3 is coupled to a second terminal of the capacitor C2, a second terminal of the switch Q3 is configured to receive a system voltage VSS, and a control terminal of the switch Q3 is coupled to the control node Q. The switch Q3 is selectively turned on according to the control voltage level Q[n] of the control node Q, so as to transmit the system voltage VSS to the second terminal of the capacitor C2. In various embodiments, the system voltage VSS may be configured to be at the voltage level VL, but the present disclosure is not limited thereto. A first terminal of the switch Q4 is coupled to the second terminal of the capacitor C1, a second terminal of the switch Q4 is configured to receive the system voltage VSS, and a control terminal of the switch Q4 is coupled to the second terminal of the capacitor C2. The switch Q4 is selectively turned on according to the voltage level of the second terminal of the capacitor C2, so as to transmit the system voltage VSS to the second terminal of the capacitor C1.

Figure 4:
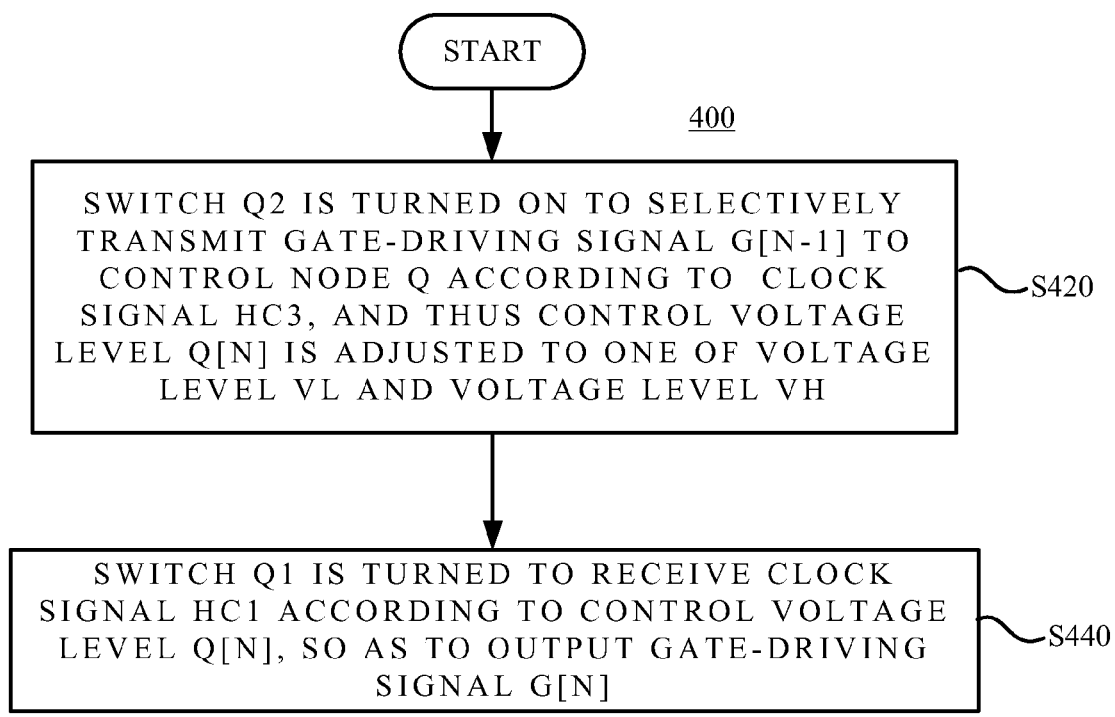
FIG. 4 is a flow chart of a control method according to one embodiment of the present disclosure.
Figure 5:
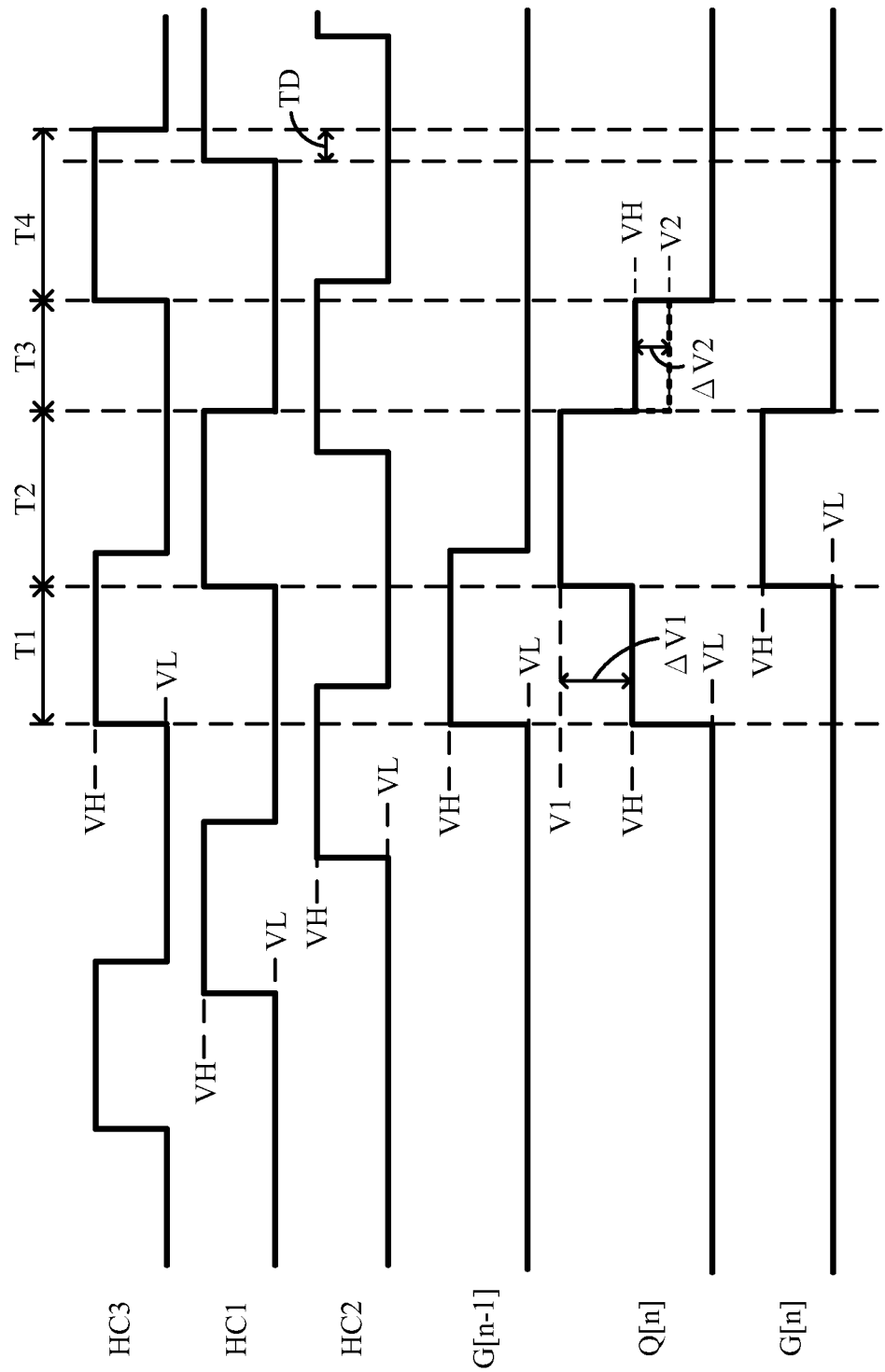
FIG. 5 is a timing diagram of the signals when the driving stage in FIG. 3 operates the control method in FIG. 4 according to one embodiment of the present disclosure.
Figure 6A:
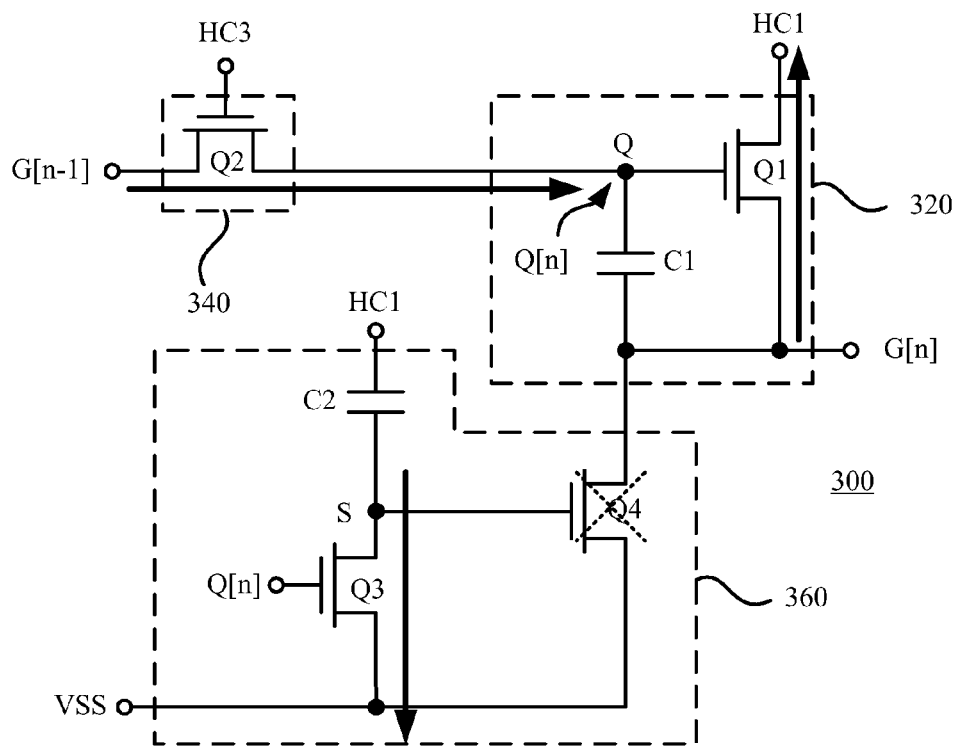
FIG. 6A is a schematic diagram of the state of each switch of the driving stage in FIG. 3 during time T1 according to one embodiment of the present disclosure.

FIG. 4 is a flow chart of a control method according to one embodiment of the present disclosure. The control method 400 can be applied to the gate driver 200 and the driving stage 300, but not limited thereto. FIG. 5 is a timing diagram of the signals when the driving stage in FIG. 3 operates the control method in FIG. 4 according to one embodiment of the present disclosure. FIG. 6A is a schematic diagram of the state of each switch of the driving stage in FIG. 3 during time T1 according to one embodiment of the present disclosure. Reference is made to FIG. 4, FIG. 5, and FIG. 6A.

As an example, the driving stages 300 of FIG. 3 are described as implementing the control method 400.

As shown in FIG. 4, the control method 400 includes step 420 and step 440. In step 420, the switch Q2 is turned on to selectively transmit the gate-driving signal G[n−1] to the control node Q according to the clock signal HC3, and thus the control voltage level Q[n] is adjusted to one of the voltage level VL and the voltage level VH. In step 440, the switch Q1 is turned to receive the clock signal HC1 according to the control voltage level Q[n], so as to output the gate-driving signal G[n].

For example, as shown in FIG. 5 and FIG. 6A, during time period T1, the gate-driving signal G[n−1], outputted from the (N−1)-th driving stage 300, is at a high voltage level, e.g., the voltage level VH, the clock signal HC3 is at the high voltage level, and the clock signal HC1 is at a low voltage level, e.g., the voltage level VL. Thus, the switch Q2 is turned on to transmit the gate-driving signal G[n−1] to the control node Q, and the control voltage level Q[n] of the control node Q is pulled up to the voltage level VH. At the same time, as the control voltage level Q[n] is pulled up to the voltage level VH, the switch Q3 is turned on to transmit the system voltage VSS to the second terminal, i.e., a node S, of the capacitor C2, and thus the voltage level of the node S is pulled down to the voltage level VL. As a result, the switch Q4 is turned off.

Figure 6B:
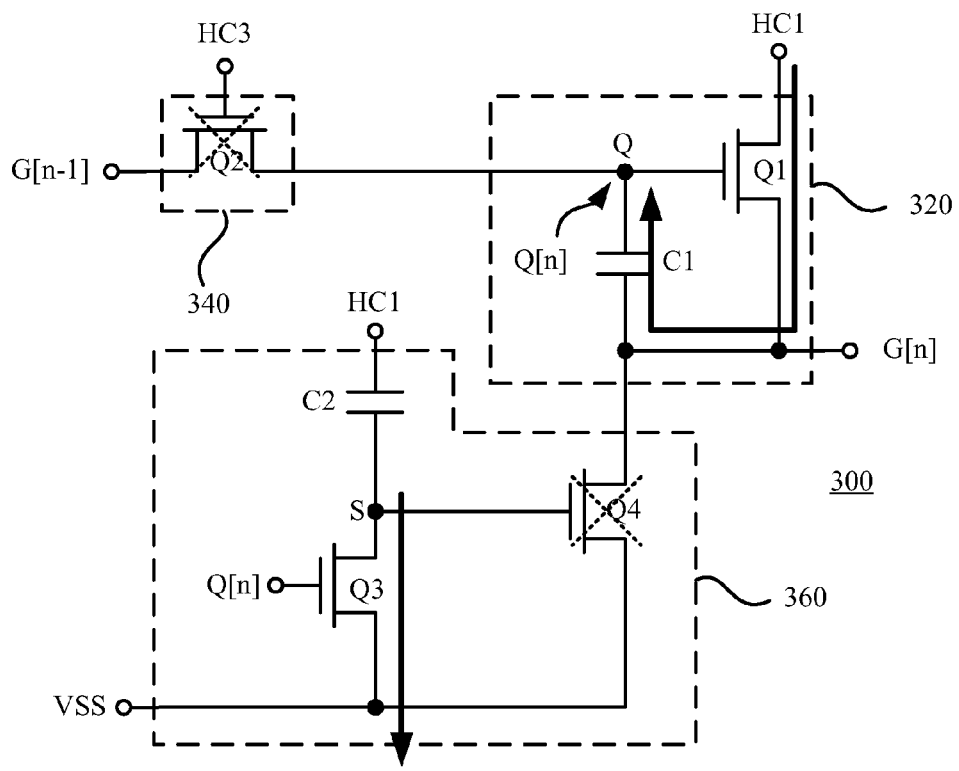
FIG. 6B is a schematic diagram of the state of each switch of the driving stage in FIG. 3 during time T2 according to one embodiment of the present disclosure.

Reference is made to both of FIG. 5 and FIG. 6B. FIG. 6B is a schematic diagram of the state of each switch of the driving stage in FIG. 3 during time T2 according to one embodiment of the present disclosure.

As shown in FIG. 5 and FIG. 6B, during time period T2, the clock signal HC3 is switched to be at the voltage level VL, and the clock signal HC3 is switched to be at the voltage level VH. Thus, the switch Q2 is turned off. As the control voltage level Q[n] is already pulled up to the voltage level VH during the time period T1, the switch Q1 and switch Q3 are remain turned on. As a result, the control node Q is charged by the clock signal HC1 via the capacitor Q1, and the control voltage node Q[n] of the control node Q is pulled up to a voltage level V1. The voltage level can be expressed as: V1=VH+ΔV1, where ΔV1 indicates a voltage difference. Moreover, since the switch Q1 is turned on, the gate-driving signal G[n], outputted from the N-th stage of the driving stage 300, follows the clock signal HC1 to be at the voltage level VH.

Figure 6C:
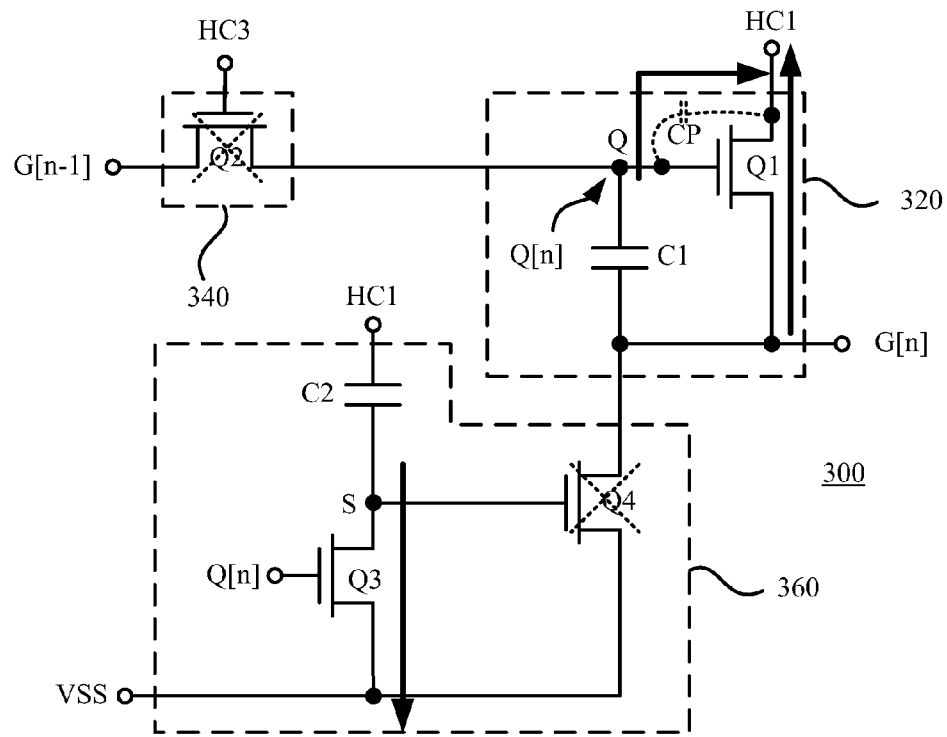
FIG. 6C is a schematic diagram of the state of each switch of the driving stage in FIG. 3 during time T3 according to one embodiment of the present disclosure.

Reference is made to both of FIG. 5 and FIG. 6C. FIG. 6C is a schematic diagram of the state of each switch of the driving stage in FIG. 3 during time T3 according to one embodiment of the present disclosure.

As shown in FIG. 5 and FIG. 6C, during time period T3, both of the clock signal HC3 and the clock signal HC1 are at the voltage level VL. Thus, the switch Q2 is turned off. As the control voltage level of the control voltage level Q[n] is already pulled up to the voltage level V1 during the time period T2, the switch Q1 and the switch Q3 are remain turned on, and the switch Q4 is remain turned off. As a result, the clock signal HC1 is switched to be at the voltage level VL, and the gate-driving signal G[n], outputted from the N-th stage of the driving stage 300, follows the clock signal HC1 to be at the voltage level VL. At the same time, the control voltage level Q[n] of the control node Q is pulled down to the voltage level VH via the capacitor C1. In some other embodiments, the control node Q is further coupled to the first terminal of the switch Q1 via a parasitic capacitor CP of the switch Q1. As a result, the control node Q discharges via both of the capacitor C1 and the parasitic capacitor CP, and the control voltage node Q[n] is thus pulled down to a voltage level V2. The voltage level V2 can be expressed as: V2=VH−ΔV2, where Δ V2 indicates a voltage difference.

Figure 6D:
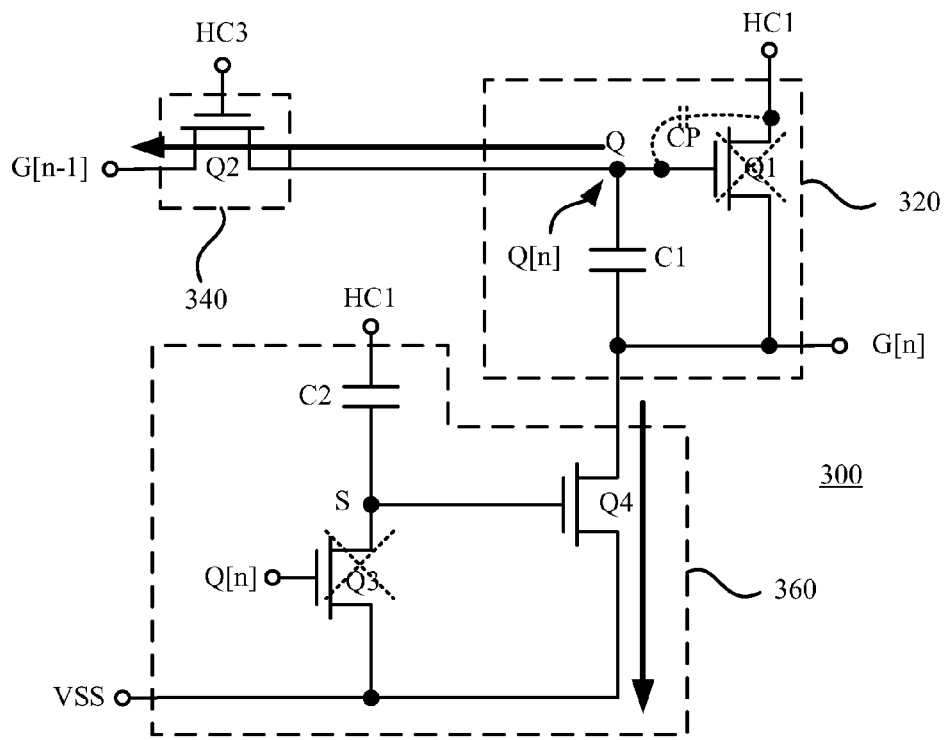
FIG. 6D is a schematic diagram of the state of each switch of the driving stage in FIG. 3 during time T4 according to one embodiment of the present disclosure.

Reference is made to both of FIG. 5 and FIG. 6D. FIG. 6D is a schematic diagram of the state of each switch of the driving stage in FIG. 3 during time T4 according to one embodiment of the present disclosure.

As shown in FIG. 5, during time period T4, the clock signal HC3 is switched to be at the voltage level VH, and the clock signal HC1 is kept being at the voltage level VL for a certain time period, then is switched to be at the voltage level VH. Thus, the switch Q2 is turned on to transmit the gate-driving signal G[n−1] with the voltage level VL to the control node Q, so that the control voltage level Q[n] of the control node Q is pulled down to the voltage level VL. The switch Q3 and the switch Q4 are thus turned off. At this time, as the clock signal HC1 is at the voltage level VH, the switch Q4 is turned on to transmit the system voltage VSS to the second terminal of the capacitor C1. As a result, the gate-driving signal G[n] can be pulled down to the voltage level VL steadily.

As shown in FIG. 5, a predetermined time interval TS is configured to be present between a rising edge of the clock signal HC1 and a falling edge of the clock signal HC3. During the time interval TD, the clock signal HC1 begins to transit to the voltage level VH, so that the driving stage 300 can perform the subsequent operations of next period. Since the clock signal HC3 is at the voltage level VH in the time interval TD, the switch Q3 is turned on to transmit the gate-driving signal to the control node Q, and thus the control voltage level Q[n] is able to be kept at the voltage level steadily. As a result, the disturbance from the parasitic capacitor CP and the clock signal HC1 can be reduced, and thus the operational reliability of the driving stage 300 can be improved.

The predetermined time interval TD can be determined according to an overlapping ratio between an enabling period (i.e., time interval for being at the voltage level VH) of the clock signal HC3 and an enabling period of the clock signal HC1. For example, the predetermined time interval TD can be configured to make the overlapping ratio between the enabling period of the clock signal HC3 and the enabling period of the clock signal HC3 is about 10%-50%. The operations illustrated above are for illustrative purpose only, and the present disclosure is not limited thereto. Person skilled in the art is able to adjust the amount of the predetermined time interval TD according to the practical applications.

In certain similar approaches, the phase of the clock signal HC1 and the phase of the clock signal HC3 are opposite to each other. In other words, when the clock signal HC1 is at the voltage level VL, the clock signal HC3 is at the voltage level VH; when the clock signal HC1 is at the voltage level VH, the clock signal HC3 is at the voltage level VL. When the clock signal HC1 is switched from the voltage level VL to the voltage level VH, the switch Q2 is turned off. At the same time, the clock signal HC1 is transmitted to the control node Q via the parasitic capacitor CP, and thus the control voltage level Q[n] of the control node Q is pulled up to the voltage level VH. As a result, the switch Q1 is incorrectly turned on, and thus unnecessary leakage current is correspondingly generated. In other words, if the phase of the clock signal HC1 and the phase of the clock signal HC3 are opposite to each other, the switch Q1 generates unnecessary leakage current, and thus unnecessary power consumption are caused. Furthermore, when the leakage current is too high, the operations of the driving stage 300 are failure.

Compared with those similar approaches, the input control unit 340 is able to pull down the control voltage level Q[n] to the voltage level VL during the predetermined time interval TD, so that the disturbance from the capacitive coupling effect on the control node Q is significantly reduced, and thus the operation reliability of the driving stage 300 is improved. Further, through such configurations, a certain extent of the operation reliability of the driving stage 300 can be achieved without using large-size capacitor for the capacitor C1 and the capacitor C2. Moreover, the driving stage 300 can perform the operations of outputting the gate-driving signal G[n] by utilizing only fourth switches Q1-C4, and thus the driving stage 300 can be applied to the slim border products.

In summary, the display panel, the gate driver, and the control method of the present disclosure can be applied to the slim border products, and the operations reliability under the capacitive effect can be improved.

It will be apparent to those skilled in the art that various modifications and variations can be made to the structure of the present disclosure without departing from the scope or spirit of the disclosure. In view of the foregoing, it is intended that the present disclosure cover modifications and variations of this invention provided they fall within the scope of the following claims.

What is claimed is:

1. A display panel, comprising:
    a plurality of gate lines; and
    a gate driver comprising a plurality of series-coupled driving stages, wherein each of the series-coupled driving stages is electrically coupled to a corresponding gate line of the gate lines, and an N-th stage of the series-coupled driving stages comprises:
        a driving unit configured to selectively transmit a first clock signal according to a control voltage level of a control node to output a first gate-driving signal; and
        an input control unit configured to selectively transmit a second gate-driving signal outputted from an (N−1)-th stage of the series-coupled driving stages to the control node according to a second clock signal, so as to adjust the control voltage level to one of a first voltage level and a second voltage level, wherein N is a positive integer, and the first voltage level is lower than the second voltage level,
    wherein a predetermined time interval is present between a rising edge of the first clock signal and a falling edge of the second clock signal, and the input control unit pulls the control voltage level to the first voltage level during the predetermined time interval.

2. The display panel of claim 1, wherein the input control unit comprises:
    a switch configured to transmit the second gate-driving signal to the control node during the predetermined time interval to pull down the control voltage level to the first voltage level.

3. The display panel of claim 2, wherein when the second clock signal is at the second voltage level, the switch is further configured to transmit the second gate-driving to the control node to pull up the control voltage level to the second voltage level.

4. The display panel of claim 2, wherein when the first clock signal is at the first voltage level and the second clock signal is at the second voltage level, the switch is turned off, and the control voltage level is pulled down to the first voltage level by the driving unit.

5. The display panel of claim 1, wherein the driving unit comprises:

a first capacitor, wherein a first terminal of the first capacitor is coupled to the control node, and a second terminal of the first capacitor is configured to output the first gate-driving signal; and
    a first switch configured to selectively transmit the first clock signal to the second terminal of the first capacitor according to the control voltage level.

6. The display panel of claim 5, wherein when the first clock signal is at the second voltage level, the control voltage level is pulled up to a third voltage level through the first capacitor, wherein the third voltage level is higher than the second voltage level.

7. The display panel of claim 5, wherein the N-th driving stage further comprises:
    a voltage stabilization unit configured to pull down the control voltage level to the second voltage level when both of the first clock signal and the second clock signal are at the first voltage level.

8. The display panel of claim 7, wherein the voltage stabilization unit comprises:
    a second capacitor, wherein a first terminal of the second capacitor is configured to receive the first clock signal;
    a second switch configured to selectively transmit a system voltage to a second terminal of the second capacitor according to the control voltage level; and
    a third switch configured to be selectively turned to transmit the system voltage to the second terminal of the first capacitor according to a voltage level of the second terminal of the second capacitor.

9. A gate driver comprising a plurality of series-coupled driving stages, each one of the series-coupled driving stages comprising:
    a first switch, wherein a first terminal of the first switch is configured to receive a first clock signal, a second terminal of the first switch is configured to output a first gate-driving signal, and a control terminal of the first switch is coupled to a control node;
    a second switch, wherein a first terminal of the second switch is configured to receive a second gate-driving outputted from a previous driving stage, a second terminal of the second switch is coupled to the control node, and a control terminal of the second switch is configured to receive a second clock signal; and
    a first capacitor, wherein a first terminal of the first capacitor is coupled to the control node, and a second terminal of the first capacitor is coupled to the second terminal of the first switch,
    wherein a predetermined time interval is present between a rising edge of the first clock signal and a falling edge of the second clock signal, and the second switch is turned on to keep a voltage level of the control node being at a low voltage level during the predetermined time interval.

10. The gate driver of claim 9, further comprising:
    a second capacitor, wherein a first terminal of the second capacitor is configured to receive the second clock signal;
    a third switch, wherein a first terminal of the third switch is coupled to a second terminal of the second capacitor, a second terminal of the third switch is configured to receive a system voltage, and a control terminal of the third switch is coupled to the control node; and
    a fourth switch, wherein a first terminal of the fourth switch is coupled to the second terminal of the first capacitor, a second terminal of the fourth switch is configured to receive the system voltage, and a control terminal of the fourth switch is coupled to the control node.

11. A control method for controlling a gate driver, the gate driver comprising a plurality of series-coupled driving stages, wherein each of the series-coupled driving stage comprises a first switch and a second switch, and the control method comprises:
    turning on the second switch to selectively transmit a first gate-driving signal outputted from a previous driving stage to a control node according to a first clock signal, so as to adjust a control voltage level of the control node to one of a first voltage level and a second voltage level, wherein the first voltage level is lower than the second voltage level; and
    turning on the first switch to receive a second clock signal according to the control voltage level, so as to output a second gate-driving signal,
    wherein a predetermined time interval is present between a falling edge of the first clock signal and a rising edge of the second clock, and the control voltage level is pulled down to the first voltage level by the second switch during the predetermined time interval.

12. The control method of claim 11, wherein the step of adjusting the control voltage level comprises:
    turning on the second switch to transmit the first gate-driving signal to the control node during the predetermined time interval, so as to pull down the control voltage level to the first voltage level.

13. The control method of claim 11, wherein the step of adjusting the control voltage level comprises:
    turning on the second switch to transmit the first gate-driving to the control node when the first clock signal is at the second voltage level, so as to pull up the control voltage level to the second voltage level.

14. The control method of claim 11, wherein each of the series-coupled driving stages comprises a first capacitor, a first terminal of the first capacitor is coupled to the control node, a second terminal of the first capacitor is configured to output the second gate-driving signal, and the step of outputting the second gate-driving signal comprises:
    turning on the first switch to transmit the second clock signal to the second terminal of the first capacitor according to the control voltage level; and
    pulling up the control voltage level to a third voltage level through the first capacitor when the second clock signal is at the second voltage level, so as to output the second gate-driving signal, wherein the third voltage level is higher than the second voltage level.

15. The control method of claim 14, further comprising:
    when the first clock signal is at the second voltage level and the second clock signal is at the first voltage level, turning off the second switch and turning on the first switch to pull down the control voltage level to the first voltage level.

16. The control method of claim 11, wherein each of the series-coupled driving stages further comprises a voltage stabilization unit, and the control method further comprises:
    pulling down the control voltage level, by the voltage stabilization unit, to the second voltage level when both of the first clock signal and the second signal are at the first voltage level.

17. The control method of claim 16, wherein the voltage stabilization unit comprises a second capacitor, a third switch, and a fourth switch, and the step of pulling down the control voltage level to the second voltage level by the voltage stabilization unit comprises:
    receiving the second clock signal by a first terminal of the second capacitor;
    turning on the third switch to selectively transmit a system voltage to a second terminal of the second capacitor according to the control voltage level; and
    turning on the fourth switch according to a voltage level of the second terminal of the second capacitor, so as to pull down the second gate-driving signal to the first voltage level by the system voltage.

* * * * *